United States Patent
Yawata et al.

(10) Patent No.: US 9,358,771 B2
(45) Date of Patent: Jun. 7, 2016

(54) METHOD FOR PRODUCING FLEXOGRAPHIC PRINTING PLATE

(71) Applicant: TOYOBO CO., LTD., Osaka-shi, Osaka (JP)

(72) Inventors: Yukimi Yawata, Okayama (JP); Daiki Yoshioka, Okayama (JP); Kazuya Yoshimoto, Okayama (JP)

(73) Assignee: TOYOBO CO., LTD., Osaka (JP)

( * ) Notice: Subject to any disclaimer, the term of this patent is extended or adjusted under 35 U.S.C. 154(b) by 0 days.

(21) Appl. No.: 14/762,022

(22) PCT Filed: Mar. 24, 2014

(86) PCT No.: PCT/JP2014/058034
§ 371 (c)(1),
(2) Date: Jul. 20, 2015

(87) PCT Pub. No.: WO2014/157064
PCT Pub. Date: Oct. 2, 2014

(65) Prior Publication Data
US 2015/0336371 A1     Nov. 26, 2015

(30) Foreign Application Priority Data
Mar. 28, 2013    (JP) ................. 2013-068356

(51) Int. Cl.
*B41N 1/12*    (2006.01)
*B41C 1/05*    (2006.01)
*B05D 1/18*    (2006.01)
*G03F 7/40*    (2006.01)
*G03F 7/033*    (2006.01)

(52) U.S. Cl.
CPC ... *B41C 1/05* (2013.01); *B05D 1/18* (2013.01); *G03F 7/405* (2013.01); *G03F 7/033* (2013.01)

(58) Field of Classification Search
CPC ....................................................... B41N 1/12
See application file for complete search history.

(56) References Cited

U.S. PATENT DOCUMENTS

2007/0160933 A1    7/2007   Onoda
2012/0251834 A1   10/2012   Yoshimoto et al.

FOREIGN PATENT DOCUMENTS

| JP | 51-47805 A | 4/1976 |
|----|------------|--------|
| JP | 63-88555 A | 4/1988 |
| JP | 5-134410 A | 5/1993 |
| JP | 10-171111 A | 6/1998 |
| JP | 2002-292985 A | 10/2002 |
| JP | 2007-106844 A | 4/2007 |
| WO | 2005/064413 A1 | 7/2005 |
| WO | 2007/116941 A1 | 10/2007 |
| WO | 2011/081084 A1 | 7/2011 |

OTHER PUBLICATIONS

Notification of Transmittal of Translation of the International Preliminary Report on Patentability (Form PCT/IB/338) issued in counterpart International Application No. PCT/JP2014/058034 dated Oct. 8, 2015, with Forms PCT/IB/373 and PCT/ISA/237 (7 pages).
International Search Report dated Jun. 10, 2014, issued in corresponding application No. PCT/JP2014/058034 (2 pages).

*Primary Examiner* — Chanceity Robinson
(74) *Attorney, Agent, or Firm* — Westerman, Hattori, Daniels & Adrian, LLP

(57) ABSTRACT

A method is disclosed for producing a flexographic printing plate from a flexographic printing original plate provided with a photosensitive resin layer comprising a photosensitive resin composition containing at least (A) a hydrophobic polymer comprising a water-dispersible latex, (B) a photopolymerizable compound and (C) a photopolymerization initiator, wherein the method comprises a main exposure step, a development step and a post-exposure step, characterized in that a treatment solution containing a first amino-modified silicone having an amine equivalent of 1000 g/mol or less and a second amino-modified silicone having an amine equivalent of 3000 g/mol or more in a mass ratio of from 2.5:1 to 1:6 is contacted with the whole surface of the flexographic printing plate.

3 Claims, No Drawings

METHOD FOR PRODUCING FLEXOGRAPHIC PRINTING PLATE

TECHNICAL FIELD OF THE INVENTION

The present invention relates to a method for producing a flexographic printing plate which allows a high-quality printing in a large scale.

BACKGROUND ART

As mentioned in Patent Documents 1 to 3 for example, common photosensitive resin plates for flexography are produced via exposure, development and post-exposure steps. A printing method using the photosensitive resin plate for flexography is such a method wherein ink is supplied onto the convex surface of uneven resin plate using an ink-supplying roll or the like and then the printing plate is contacted with the material to be printed so that the ink on the convex surface is transferred to the material to be printed. In the flexography as such, adhesion of the ink to a shoulder area of the convex surface of the printing plate or invasion of the ink to the concave surface (hereinafter, it will be referred to "plate surface contamination") often happens during the printing for long time. As a result, even the area which is not the inherent pattern area may be printed resulting in deterioration of the printing quality.

Particularly in recent years, application of flexography to a highly precise printing has been in progress and a halftone dot printing in high line numbers has been briskly carried out for creating the gradation of color and concentration. Since intervals among the halftone dots become smaller in that case, the ink is more apt to be filled in the concaves of the halftone dots of the printing plate. When the ink is accumulated in the concaves of the printing plate in a predetermined amount or more, it transfers to the material to be printed to generate the dot bridging resulting in a significant deterioration of the printing quality.

One of the characteristics of flexography is that it can cope with various types of ink such as aqueous ink, alcoholic ink, solvent-type ink or UV ink. On the other hand, there has been a demand for preventing plate surface contamination even when any type of ink is used. It is particularly necessary to prevent plate surface contamination even if an ink having high permeability to the plate material such as solvent-type ink or UV ink is used.

Several methods have been proposed already concerning the prevention of plate surface contamination of a flexographic printing plate. For example, Patent Document 4 discloses a method wherein silicone oil, silicone rubber, silicone varnish or fluorine compound is adhered, by means of brushing or spraying, onto a printing plate mainly comprising polyester resin. Although some preventing effects for plate surface contamination are achieved by such a method, the plate surface contamination cannot be prevented in a halftone dot printing in high line numbers having narrow intervals among the dots.

In Patent Document 5, there is proposed a method wherein a mixture of an aqueous resin and an aqueous emulsion of silicone compound or fluorine compound is applied onto a printing plate comprising an elastomer. In this method, due to the use of a non-modified silicone compound, an effect of preventing the plate surface contamination is not sufficient.

In Patent Document 6, there is proposed a method for contacting a flexographic printing plate with a solution containing a modified silicone compound after the exposure step during production of flexographic printing plate. In this method, an improvement in the effect of preventing the plate surface contamination is noted due to the use of a modified silicone compound. However, in a long-run printing, plate surface contamination generates and, its persisting effect is not sufficient.

In Patent Document 7, there is proposed a method wherein a liquid containing an amino-modified silicone compound is contacted with a flexographic printing plate containing latex having gelling degree of 50% by mass or more. In this method, an improvement in an ability to prevent plate surface contamination can be expected due to an interaction of the amino-modified silicone compound with the gelled latex and/or due to an interaction of the amino-modified silicone compound with an emulsifier. However, the method does not satisfy any of the prevention of plate surface contamination and persistency thereof whereby it is not sufficient for a high-quality printing in a large scale.

In Patent Document 8, there is proposed a method wherein an organosilicon compound is contained in a flexographic printing plate. In this method, an ink-repelling ingredient is contained in a resin composition and, as compared with a method wherein an ink-repelling ingredient is contacted with a plate surface, a better persisting effect is achieved. However, content of the organosilicon compound in the resin composition for the printing plate is as small as 0.05% by mass to 1.0% by mass and amount of the ink-repelling ingredient existing on the surface of the printing plate is small. Therefore, the ability to prevent plate surface contamination cannot be said to be satisfactory.

PRIOR ART DOCUMENTS

Patent Documents

Patent Document 1: Japanese Patent Application Laid-Open (JP-A) No. 171111/98
Patent Document 2: Japanese Patent Application Laid-Open (JP-A) No. 88555/88
Patent Document 3: Japanese Patent Application Laid-Open (JP-A) No. 134410/93
Patent Document 4: Japanese Patent Application Laid-Open (JP-A) No. 47805/76
Patent Document 5: Japanese Patent Application Laid-Open (JP-A) No. 2002-292985
Patent Document 6: WO 2005/064413
Patent Document 7: WO 2011/081084
Patent Document 8: WO 2007/116941

DISCLOSURE OF THE INVENTION

Problem that the Invention is to Solve

The present invention has been created in view of the current status of the above-mentioned prior art and its object is to provide a method for producing a flexographic printing plate which has an ability to prevent plate surface contamination and a persistency of the effect thereof and which allows a high-quality printing in a large scale.

Means for Solving the Problem

The present inventors have conducted eager investigations for achieving such an object and, as a result, they have found that the above object can be achieved when a treatment solution containing two kinds of amino-modified silicones having specific amine equivalents is contacted with the whole surface of a resin printing plate of a flexographic printing original plate whereby they have accomplished the present invention.

Thus, the constitution of the present invention is as mentioned in the following (1) to (3).

(1) A method for producing a flexographic printing plate from a flexographic printing original plate provided with a photosensitive resin layer comprising a photosensitive resin composition containing at least (A) a hydrophobic polymer comprising a water-dispersible latex, (B) a photopolymerizable compound and (C) a photopolymerization initiator, wherein the method comprises a main exposure step, a development step and a post-exposure step, characterized in that a treatment solution containing a first amino-modified silicone having an amine equivalent of 1000 g/mol or less and a second amino-modified silicone having an amine equivalent of 3000 g/mol or more in a mass ratio of from 2.5:1 to 1:6 is contacted with the whole surface of the flexographic printing plate.

(2) The method for producing a flexographic printing plate according to (1), wherein contact of the treatment solution is carried out by means of application of the treatment solution to the surface of the printing plate or by means of immersion of the printing plate into the treatment solution.

(3) The method for producing a flexographic printing plate according to (1) or (2), wherein contact of the treatment solution is carried out after the development step and immediately before the post-exposure step.

Advantages of the Invention

In the method for producing a printing plate according to the present invention, the surface of a resin printing plate is treated with a treatment solution containing specific two kinds of amino-modified silicones whereby an excellent ability to prevent plate surface contamination and a persistency of the effect thereof can be given to the printing plate. As a result of using a flexographic printing plate produced by the production method according to the present invention, a plate surface contamination does not occur for long time and a stable high-quality printing in a large scale can be carried out.

BEST MODE FOR CARRYING OUT THE INVENTION

In the method for producing a printing plate according to the present invention, a flexographic printing plate is produced from a flexographic printing original plate provided with a photosensitive resin layer comprising a photosensitive resin composition containing at least (A) a hydrophobic polymer comprising a water-dispersible latex, (B) a photopolymerizable compound and (C) a photopolymerization initiator, wherein the method comprises a main exposure step, a development step and a post-exposure step.

Firstly, an explanation will be made for a photosensitive resin composition which constitutes the photosensitive resin layer of the printing original plate. The photosensitive resin composition of the present invention contains (A) a hydrophobic polymer comprising a water-dispersible latex, (B) a photopolymerizable compound and (C) a photopolymerization initiator as essential ingredients.

As to the ingredient (A) (a hydrophobic polymer comprising a water-dispersible latex), one or more kind(s) thereof may be used. Particularly for a high-quality printing being excellent in reproduction of fine images, it is preferred to use two or more kinds. When two or more kinds of latexes are used, both of the water developable property of unexposed part of the printing original plate and the water resistance of exposed part thereof can be achieved and it is possible to produce a flexographic printing original plate for a high-quality printing being excellent in reproduction of fine images. As the ingredient (A), a latex may be selected appropriately from among conventional latices. For example, a polybutadiene latex, a styrene-butadiene copolymer latex, an acrylonitrile-butadiene copolymer latex, a methyl methacrylate-butadiene copolymer latex, etc. can be used. Further, these latices may have been modified with (meth)acrylate, carboxy, silicone, fluorine etc. Here, because a variety of synthetic latex and natural latex are available on the market as water-dispersible latices, a proper one may be selected from among them.

Among the above, a hydrophobic polymer comprising a water-dispersible latex containing a butadiene skeleton in a molecular chain is preferably used in view of hardness and rubber elasticity. To be more specific, a polybutadiene latex and an acrylonitrile-butadiene copolymer latex are preferred. Compounding amount of the ingredient (A) in the resin composition is preferred to be 40 to 80% by mass. When it is less than 40% by mass, strength as a printing plate is insufficient whereby that is not preferred. When it exceeds 80% by mass, a water development step is time-consuming whereby that is not preferred.

The ingredient (B) (a photopolymerizable compound) has a role to polymerize and crosslink by light irradiation, thereby forming a dense network in a printing plate for shape maintenance. Preferably, the photopolymerizable compound (B) comprises a photopolymerizable oligomer. A photopolymerizable oligomer is a polymer wherein an ethylenic unsaturated group binds to terminal and/or side chain of a conjugated diene-based polymer and which preferably has a number average molecular weight of 1,000 to 10,000.

The conjugated diene-based polymer is formed of a homopolymer of a conjugated diene unsaturated compound or a copolymer of a conjugated diene unsaturated compound and a monoethylenically unsaturated compound. Examples of such a copolymer include a butadiene polymer, an isoprene polymer, a chloroprene polymer, a styrene-chloroprene copolymer, an acrylonitrile-butadiene copolymer, an acrylonitrile-isoprene copolymer, a methyl methacrylate-isoprene copolymer, a methyl methacrylate-chloroprene copolymer, a methyl acrylate-butadiene copolymer, a methyl acrylate-isoprene copolymer, a methyl acrylate-chloroprene copolymer, an acrylonitrile-butadiene-styrene copolymer and an acrylonitrile-chloroprene-styrene copolymer. Among these, a butadiene polymer, an isoprene polymer and an acrylonitrile-butadiene copolymer are preferable, and a butadiene polymer and an isoprene polymer are particularly preferable from the viewpoint of rubber elasticity and photocurability.

With regard to the photopolymerizable compound, there may be used, if necessary, a commonly used photopolymerizable monomer such as meth(a)crylate in addition to the above-exemplified ones within such an extent that the effect of the present invention is not deteriorated thereby. Compounding amount of the ingredient (B) in the resin composition is preferred to be 10 to 45% by mass. When it is less than 10% by mass, there is a risk that toughness worsens. When it exceeds 45% by mass, there is a risk that development property worsens.

The ingredient (C) (photopolymerization initiator) can be any compound as far as it is capable of causing a polymerizable carbon-carbon unsaturated group to polymerize by light irradiation. Among them, a compound which has a function of generating a radical through self decomposition or hydrogen extraction caused by light absorption is used preferably.

Specific examples thereof include benzoin alkyl ethers, benzophenones, anthraquinones, benzyls, acetophenones, diacetyls and the like. Compounding amount of the ingredient (C) in the resin composition is preferred to be 0.1 to 10% by mass. When it is less than 0.1% by mass, starting efficiency decreases and image reproducibility is inferior. When it is more than 10% by mass, sensitivity becomes high and control of the time for exposing to light becomes difficult.

A hydrophilic polymer may be added to the photosensitive resin composition of the present invention in addition to the above ingredients. Hydrophilic polymers preferably include polymers having a hydrophilic group such as —COOH, —COOM (M is a monovalent, divalent or trivalent metal ion or a substituted or unsubstituted ammonium ion), —OH, —NH$_2$, —SO$_3$H and a phosphate group, and specifically include a polymer of (meth)acrylic acid or salts thereof, a copolymer of (meth)acrylic acid or salts thereof with an alkyl (meth)acrylate, a copolymer of (meth)acrylic acid or salts thereof with styrene, a copolymer of (meth)acrylic acid or salts thereof with vinyl acetate, a copolymer of (meth)acrylic acid or salts thereof with acrylonitrile, polyvinyl alcohol, carboxymethylcellulose, polyacrylamide, hydroxyethylcellulose, polyethylene oxide, polyethyleneimine, polyurethane which has a —COOM group, polyurea urethane which has a —COOM group, polyamide acid which has a —COOM group, and salts or derivatives thereof. Compounding amount of the hydrophilic polymer in the resin composition is preferred to be 2 to 30% by mass. When it is less than 2% by mass, there is a risk that development property worsens. When it exceeds 30% by mass, there is a risk that water resistance of a relief worsens.

A thermal polymerization inhibitor (stabilizer) may be added to the photosensitive resin composition of the present invention in view of enhancement of thermostability upon kneading, enhancement of stability upon storage, etc. Compounding amount of the thermal polymerization inhibitor (stabilizer) in the resin composition is usually 0.001 to 5% by mass. With regard to the thermal polymerization inhibitor, that of a phenol type, a hydroquinone type, a catechol type, etc. may be exemplified.

In the photosensitive resin composition, it is possible to appropriately add other ingredients such as plasticizer, ultraviolet absorber, dye, pigment, defoaming agent, aggregation inhibitor, silicone compound, and fluorine compound for a purpose of improving various characteristics within such an extent that the effects of the present invention are not disturbed thereby.

The photosensitive resin composition comprising the above compounding becomes a photosensitive resin layer for a flexographic printing original plate by means of a conventionally known method. From the flexographic printing original plate provided with a photosensitive resin layer, a flexographic printing plate is produced by the steps comprising main exposure step, development step and post-exposure step according to the conventionally known method.

The steps such as main exposure step, development step and post-exposure step can be carried out under the conventionally known conditions which have been used in the common methods for producing printing plates.

As to a light source for the exposure used in the main exposure step, anything will do so far as it has wavelengths of 300 nm to 500 nm and examples thereof include high-pressure mercury lamp, ultraviolet fluorescent lamp, carbon arc lamp and xenon lamp. Although there is no particular limitation for the exposure intensity at that time, an example thereof is 3 to 70 mW/cm$^2$. The exposure intensity at that time is the value obtained by a UV illuminometer (type MO-2) manufactured by Orc Manufacturing Co., Ltd. using a UV-35 filter.

As to a development apparatus used for the development step, examples thereof include a batch type development apparatus and an in-line type automated development apparatus. As to a development method, examples thereof include a development method wherein a plate in a state of being immersed in a developer is brushed so that an unexposed part is dissolved or scraped off and a development method wherein a developer is sprinkled onto a plate surface using a spray or the like and, at the same time, an unexposed part is dissolved or scraped off using a brush. As to a developer, an example thereof is an aqueous developer containing one or more kind (s) of nonionic, anionic, cationic or amphoteric surfactant (s) in which a preferred example is an aqueous developer containing an anionic surfactant although they are non-limitative. In view of the development property, it is also possible to contain a defoaming agent, an alkali agent, etc. therein.

As to a light source for the exposure used in the post-exposure step, anything will do so far as it has wavelengths of 300 nm to 500 nm and examples thereof include high-pressure mercury lamp, ultraviolet fluorescent lamp, carbon arc lamp and xenon lamp. Although there is no particular limitation for the exposure intensity at that time, an example thereof is 3 to 70 mW/cm$^2$. The exposure intensity at that time is the value obtained by a UV illuminometer (type MO-2) manufactured by Orc Manufacturing Co., Ltd. using a UV-35 filter. The post-exposure is carried out so as to polymerize/crosslink the unexposed part washed out by the development step by light irradiation.

As to a light source for the exposure used in a step using a germicidal lamp, anything will do so far as it has wavelength of 300 nm or shorter and a commercially available germicidal lamp, etc. are used. As to the irradiation dose, it is conducted by choosing the condition by which an appropriate effect is achieved. Irradiation with a germicidal lamp is conducted for eliminating the tackiness on the surface.

The method for producing a flexographic printing plate according to the present invention is characterized in that, in any of the above steps, a treatment solution containing a first amino-modified silicone having an amine equivalent of 1000 g/mol or less and a second amino-modified silicone having an amine equivalent of 3000 g/mol or more is contacted with the whole surface of the flexographic printing plate. As a result thereof, an effect for preventing plate surface contamination can be persistent.

The reason why two kinds of amino-modified silicones having different amino equivalents are used in combination in the present invention is as follows. Thus, although the first amino-modified silicone has an excellent persisting property due to abundance of amino group (cationic group; chemically adsorbing segment) contained therein, its sole use results in an insufficient ink-repelling property because of short chain length of silicone group (group having low surface tension: ink-repelling segment) contained therein. Although the second amino-modified silicone has an excellent ink-repelling property because of long chain length of silicone group (group having low surface tension: ink-repelling segment) contained therein, its sole use results in an insufficient persisting property because of few amino group (cationic group; chemically adsorbing segment) contained therein. Accordingly, when both of the first amino-modified silicone and the second amino-modified silicone are used in an appropriate ratio, they act in a complementary manner whereupon there is achieved an excellent effect for preventing plate surface contamination having both of the persisting property and the ink-repelling property.

As mentioned above, the first amino-modified silicone promotes the chemical adsorption with the surface of a flexographic printing plate and is excellent in a persisting effect. Amine equivalent of the first amino-modified silicone is 1000 g/mol or less, preferably from 300 g/mol to 1000 g/mol, and more preferably from 320 g/mol to 900 g/mol.

As to the first amino-modified silicone, any of a side-chain type, a both-end type, a one-end type and a side-chain and both-end type may be used and a preferred example is an amino-modified silicone of a side-chain type wherein both ends are modified by alkoxy groups. When an amino-modified silicone of a side-chain type wherein both ends are modified by alkoxy groups is used, a fixing property of trimethylsiloxane to the surface of a flexographic printing plate can be further enhanced.

As mentioned above, the second amino-modified silicone chemically adsorbs with the surface of a flexographic printing plate and is excellent in giving an ink-repelling property to the flexographic printing plate. Amine equivalent of the second amino-modified silicone is 3000 g/mol or more, preferably from 3000 g/mol to 10000 g/mol, and more preferably from 3000 g/mol to 9000 g/mol.

With regard to the second amino-modified silicone, any of a side-chain type, a both-end type, a one-end type and a side-chain and both-end type may be used and a preferred example is an amino-modified silicone of a side-chain type and a more preferred example is an amino-modified silicone of a side-chain type wherein both ends are not modified (i.e., both ends have methyl groups, phenyl groups or hydrogen atoms).

Although there is no particular limitation for the dynamic viscosity of the first amino-modified silicone and of the second amino-modified silicone, it is preferred to be 20 to 5000 mm$^2$/s and more preferred to be 40 to 1000 mm$^2$/s. When the dynamic viscosity is low, an ink-repelling property is insufficient while, when it is high, uneven application is apt to happen.

As to the amino-modified silicone, the followings, for example, are available on the market.

|  | Trade name | Dynamic viscosity (mm$^2$/s) | Amine equivalent (g/mol) | Manufacturer |
|---|---|---|---|---|
| First amino-modified silicone | KF-393 | 70 | 350 | Shinetsu Chemical |
|  | L-655 | 40 | 700 | Wacker Asahikasei Silicone Co., Ltd. |
|  | L-656 | 25 | 800 | Wacker Asahikasei Silicone Co., Ltd. |
|  | KF-857 | 70 | 830 | Shinetsu Chemical |
| Other amino-modified silicone | KF-8004 | 800 | 1500 | Shinetsu Chemical |
|  | KF-8002 | 1100 | 1700 | Shinetsu Chemical |
|  | KF-867 | 1300 | 1700 | Shinetsu Chemical |
|  | WR-1600 | 1000 | 1700 | Wacker Asahikasei Silicone Co., Ltd. |
|  | KF-880 | 650 | 1800 | Shinetsu Chemical |
|  | KF-861 | 3500 | 2000 | Shinetsu Chemical |
| Second amino-modified silicone | KF-869 | 1500 | 3800 | Shinetsu Chemical |
|  | WR-1300 | 1000 | 3300 | Wacker Asahikasei Silicone Co., Ltd. |
|  | WR-301 | 1000 | 3700 | Wacker Asahikasei Silicone Co., Ltd. |
|  | KF-859 | 60 | 6000 | Shinetsu Chemical |
|  | WR-1100 | 5000 | 7000 | Wacker Asahikasei Silicone Co., Ltd. |
|  | KF-860 | 250 | 7600 | Shinetsu Chemical |
|  | L-653 | 75 | 8300 | Wacker Asahikasei Silicone Co., Ltd. |

Among the above-mentioned amino-modified silicones available on the market, those having amine equivalent of 1000 g/mol or less are classified into the first amino-modified silicone. Also, those having amine equivalent of 3000 g/mol or more are classified into the second amino-modified silicone. Examples of the first amino-modified silicone include KF-857 (amine equivalent: 830 g/mol), KF-393 (amine equivalent: 350 g/mol), L-655 (amine equivalent: 700 g/mol), L-656 (amine equivalent: 800 g/mol). Examples of the second amino-modified silicone include KF-859 (amine equivalent: 6000 g/mol), KF-869 (amine equivalent: 3800 g/mol), KF-860 (amine equivalent: 7600 g/mol), L-653 (amine equivalent: 8300 g/mol), WR-1300 (amine equivalent: 3300 g/mol), WR-301 (amine equivalent: 3700 g/mol), WR-1100 (amine equivalent: 7000 g/mol).

In the present invention, an amino-modified silicone is used as a treatment solution by being dissolved in a solvent. Examples of the solvent include water, alcohol (such as methanol, ethanol or isopropyl alcohol) and a mixed solvent of water with alcohol. If necessary, in the treatment solution, a solvent such as glycerol or alkyl glycol ether may be used for enhancing permeability to the plate or an acidic compound such as formic acid or acetic acid, glycerol, surfactant or the like may be used for enhancing dissolution stability of the amino-modified silicone. It is also possible to use a silane coupling agent together therewith.

Compounding rate of the first amino-modified silicone and the second amino-modified silicone in the treatment solution is, for example, 0.05 part by mass to 5.0 parts by mass, and preferably 0.1 part by mass to 3.0 parts by mass, to 100 parts by mass of the solvent. When the compounding rate is small, an ink-repelling property is insufficient while, when it is large, uneven application is apt to happen.

The mass ratio of the first amino-modified silicone to the second amino-modified silicone in the treatment solution is from 2.5:1 to 1:6, preferably from 2:1 to 1:5, more preferably from 2:1 to 1:4, and most preferably from 1.5:1 to 1:3.5. When it is less than 2.5:1, there is a risk that ink-repelling property is insufficient while, when it is more than 1:6, there is a risk that persisting property is insufficient.

As to a method of contacting a treatment solution with a printing plate, any of the conventionally known methods may be adopted and examples thereof include a method wherein the treatment solution is applied onto the whole surface of a printing plate using an atomizer, a sprayer, a brush, etc. in an appropriate stage after the exposure step and a method wherein the printing plate is immersed in the treatment solution. When an application method is used, the applied amount is preferred to be 1 to 100 g/m$^2$ and more preferred to be 3 to 50 g/m$^2$.

After the treatment solution is contacted with the printing plate, it is preferred to conduct drying/thermal treatment at the temperature of from 40° C. and preferably from 50° C. to lower than 100° C. Drying time is preferred to be 5 minutes or longer and more preferred to be 10 minutes or longer. As a result of conducting this thermal treatment step, chemical adsorption of the amino-modified silicone compound with the printing plate becomes stronger.

Although a step of contacting the printing plate with the treatment solution may be in any stage provided that it is after the main exposure step, it is preferred to be after the development step and immediately before the post-exposure step. That is because, in the common method for producing a flexographic printing plate, drying is conducted after the development and, when the printing plate is contacted with the treatment solution after the development, both of the drying of a developer and the drying/thermal treatment of a treatment solution can be carried out at the same time whereby the steps can be made simple.

A step of contacting the printing plate with the treatment solution may also be done after the steps of post-exposure and irradiation with a germicidal lamp. When the treatment solution is contacted after the steps of post-exposure and irradiation with a germicidal lamp, it is preferred to conduct the drying/thermal treatment once again at the temperature of from 40° C. and preferably from 50° C. to lower than 100° C. As a result of this thermal treatment step, chemical adsorption of the amino-modified silicone compound with the printing plate can become stronger.

EXAMPLES

The present invention will now be specifically illustrated by way of the following Examples and Comparative Examples although the present invention is not limited thereto.

Example 1

Preparation of Photosensitive Resin Composition

Butadiene latex (Nipol LX111NF containing 55% of non-volatile ingredients; manufactured by Nippon Zeon) (46 parts by mass) and 11 parts by mass of acrylonitrile-butadiene latex (Nipol SX1503 containing 43% of non-volatile ingredients; manufactured by Nippon Zeon); 11 parts by mass of oligobutadiene acrylate (ABU-4S manufactured by Kyoeisha Kagaku), 4.5 parts by mass of lauryl methacrylate (Light Ester L manufactured by Kyoeisha Kagaku) and 4.5 parts by mass of trimethylolpropane triacrylate (Light Ester TMP manufactured by Kyoeisha Kagaku) as photopolymerizable compounds; 0.6 part by mass of a photopolymerization initiator (Irgacure 651); and 12 parts by mass of a hydrophilic polymer (PFT-3 containing 25% of non-volatile ingredients, manufactured by Kyoeisha Kagaku) and 0.06 part by mass of hydroquinone monomethyl ether as other ingredients were mixed in a container to prepare a dope. The dope was poured into a pressurizing kneader and toluene and water were removed therefrom in vacuo at 80° C.

Production of Flexographic Printing Original Plate

Carbon black dispersion (AMBK-8 manufactured by Orient Kagaku Kogyo KK), copolymerized polyamide (PA223 manufactured by TOYOBO CO., LTD.), propylene glycol and methanol were mixed in a ratio of 45/5/5/45 by mass to prepare a coating liquid for infrared ablation layer. After a releasing treatment was applied onto both sides of a PET film (E5000 manufactured by TOYOBO CO., LTD.; thickness: 100 μm), the coating liquid for infrared ablation layer was applied thereto using a bar coater so as to make the thickness of the coat after drying 1.6 μm and then dried at 120° C. for 5 minutes to prepare a film laminate (I). Optical density thereof was 2.3. This optical density was measured by a white-and-black transmission densitometer DM-520 (manufactured by Dainippon Screen). Polyvinyl acetate having saponification degree of 80% (KH20 manufactured by Nippon Gosei), plasticizer (Sanflex SE 270 manufactured by Sanyo Chemical Industries; polyether polyol of an aliphatic polyhydric alcohol type; solid concentration 85%) and NBR latex (SX1503A manufactured by Nippon Zeon; solid concentration 42%) were mixed in a ratio by mass of 50/20/30 to give a coating liquid for a protective layer. The coating liquid for a protective layer was applied onto the film laminate (I) using a bar coater so as to make the thickness of the coat after drying 2.0 μm and dried at 120° C. for 5 minutes to prepare a film laminate (II). The above photosensitive resin composition was placed on a PET film support (E5000 manufactured by TOYOBO CO., LTD.; thickness: 125 μm) on which an adhesive of a copolymerized polyester type was applied and a film laminate (II) was layered thereon. The above was laminated at 100° C. using a heat press machine to give a flexographic printing original plate comprising PET support, adhesive layer, photosensitive resin layer, protective layer, infrared ablation layer and protective film. Total thickness of the plate was 1.70 mm.

Production of Printing Plate from Flexographic Printing Original Plate

Chemical ray (light source: Philips 10R; illumination at 365 nm: 8 mW/cm$^2$) was irradiated for one minute from the PET support side of the printing original plate. After that, the protective film was peeled off therefrom. This plate was wound around Esko CDI SPARK 2530 followed by forming an image. After ablation, the plate was taken out and returned to a flat plane and chemical ray (light source: Philips 10R; illumination at 365 nm: 8 mW/cm$^2$) was irradiated thereon for seven minutes. After that, development was carried out at 40° C. for eight minutes using a development device (Stuck System, 1% washing soap aqueous solution) manufactured by A&V. Water drops on the plate surface was removed by a water draining rod. A treatment solution was prepared so as to make KF-857 (amine equivalent: 830 g/mol; manufactured by Shinetsu Chemical)/KF-859 (amine equivalent: 6000 g/mol; manufactured by Shinetsu Chemical)/isopropyl alcohol=0.1/0.3/100 (ratio by mass). The treatment solution was sprayed onto the whole surface of the printing plate using a sprayer. Applied amount was 10 g/m$^2$. After development, it was dried in a dryer at 60° C. for ten minutes, chemical ray was irradiated thereon for ten minutes and, finally, a germicidal lamp was irradiated thereon for five minutes for removing the stickiness on the surface.

Examples 2 to 14 and Comparative Examples 1 to 5

The same operation as in Example 1 was conducted except that the composition of the amino-modified silicone in the treatment solution was changed as shown in Table 1 whereby a photosensitive resin composition, a flexographic printing original plate and a flexographic printing plate were prepared.

The printing plates of Example 1 to 14 and Comparative Examples 1 to 5 were evaluated for uneven application, surface tension, plate surface contamination and uniformity of ink in solid part in accordance with the following evaluating methods.

(1) Evaluation of Uneven Application

Uneven application was evaluated by checking the uneven application of the solid part by naked eye using the produced printing plate. In case the uneven application was hardly confirmed at a glance, in case it was easily confirmed at a glance and in case viscous uneven application was clearly noted, they were marked as "○", "Δ" and "x", respectively.

(2) Evaluation of Surface Tension

Surface tension was evaluated using a mixed solution for a wet tension test (manufactured by Kanto Chemical). Under the atmosphere of 20° C. and 60 RH %, two drops of each of the mixed solutions for a wet tension test of 22.6 mN/m, 25.4 mN/m, 27.3 mN/m, 30 mN/m, 31 mN/m, 32 mN/m, 33 mN/m, 34 mN/m, 35 mN/m, 36 mN/m, 37 mN/m, 38 mN/m, 39 mN/m and 40 mN/m were dropped onto the printing plate and spread with a cotton swab and the spread extent after 30 seconds was evaluated by naked eye. The value for the mixed solution repelled by the plate surface was adopted as surface tension. The lower the surface tension, the higher the ink-repelling property and the higher the preventive effect for ink clogging during printing. Incidentally, the samples after printing for 500 m, 1000 m, 1500 m and 2000 m were evaluated.

(3) Evaluation of Plate Surface Contamination

Plate surface contamination was evaluated using a flexographic printer FPR 302 (manufactured by MCK) and anilox of 800 LPI. A solvent ink (trade name: Bright Flex (manufactured by DIC)) was used as an ink. Coated paper (trade name: Pearl Coat; manufactured by Oji Paper) was used as a material to be printed. Printing speed was 50 m/min. Under the above condition, printing was firstly conducted for 500 m, and then the printed sample was collected. Printing was then conducted for another 500 m and a sample after printing for 1000 m in total was collected. Printing was further conducted and a sample after printing for 1500 m in total was collected. Finally, the printing was furthermore conducted and a sample after printing for 2000 m in total was collected. The halftone dots to be evaluated were in 200 LPI and the plate surface contamination was evaluated for the halftone dots of 10% and 20%. When the print surface contamination was nil, when it generated only at the front end of the halftone dots, when it generated near the terminal of the halftone dots and when it generated on the whole surface of the halftone dots, they are marked "A" "B", "C" and "D", respectively.

(4) Evaluation of Uniformity of Ink in Solid Part

Uniformity of ink in solid part was judged by naked eye for the uneven ink concentration on the solid part. When it was not confirmed, when it was partially confirmed and when it was confirmed on whole surface, they were marked ○, Δ and x, respectively.

The evaluation was conducted by using a flexographic printer FPR 302 (manufactured by MCK) and anilox of 800 LPI. A solvent ink (trade name: Bright Flex (manufactured by DIC)) was used as an ink. Coated paper (trade name: Pearl Coat; manufactured by Oji Paper) was used as a material to be printed. Printing speed was 50 m/min. With regard to the printing pressure, compression of 0.02 mm more than the optimum value was applied for the purpose of accelerating the printing durability evaluation. Under the above condition, evaluation was conducted after printing for 50 m. As to a printing plate, there was used a plate having a solid part of 5 cm width and 5 cm length.

The evaluation results of the printing plates according to Examples 1 to 14 and Comparative Examples 1 to 5 are shown in Table 1.

TABLE 1

| | | | Example | | | | | | |
|---|---|---|---|---|---|---|---|---|---|
| | | | 1 | 2 | 3 | 4 | 5 | 6 | 7 |
| Solution | First amino-modified silicone | KF-393 (amine equivalent 350 g/mol) | | | | | 0.1 | | |
| | | L-655 (amine equivalent 700 g/mol) | | | | 0.1 | | | |
| | | KF-857 (amine equivalent 830 g/mol) | 0.1 | 0.1 | 0.1 | | | 0.05 | 0.08 |
| | Second amino-modified silicone | KF-869 (amine equivalent 3800 g/mol) | | 0.3 | | | | | |
| | | KF-859 (amine equivalent 6000 g/mol) | 0.3 | | | 0.3 | 0.3 | 0.15 | 0.24 |
| | | L-653 (amine equivalent 8300 g/mol) | | | 0.3 | | | | |
| | Solvent | ethanol | | | | | | | |
| | | isopropyl alcohol | 100 | 100 | 100 | 100 | 100 | 100 | 100 |
| | | water | | | | | | | |
| | Mass ratio of the first amino-modified silicone to the second amino-modified silicone | | 1:3 | 1:3 | 1:3 | 1:3 | 1:3 | 1:3 | 1:3 |
| Evaluation | (1) uneven application | | ○ | ○ | ○ | ○ | ○ | ○ | ○ |
| | (2) surface tension (mN/m) | after printing for 500 m | 23 | 23 | 23 | 23 | 23 | 23 | 23 |
| | | after printing for 1000 m | 23 | 23 | 23 | 23 | 23 | 23 | 23 |
| | | after printing for 1500 m | 23 | 23 | 23 | 23 | 23 | 23 | 23 |
| | | after printing for 2000 m | 23 | 23 | 23 | 23 | 23 | 23 | 23 |
| | (3) plate surface contamination | after printing for 500 m | A | A | A | A | A | A | A |
| | | after printing for 1000 m | A | A | A | A | A | A | A |
| | | after printing for 1500 m | A | A | A | A | A | A | A |
| | | after printing for 2000 m | A | A | A | A | A | A | A |
| | (4) uniformity of ink in solid part | | ○ | ○ | ○ | ○ | ○ | ○ | ○ |

| | | | Example | | | | | | |
|---|---|---|---|---|---|---|---|---|---|
| | | | 8 | 9 | 10 | 11 | 12 | 13 | 14 |
| Solution | First amino-modified silicone | KF-393 (amine equivalent 350 g/mol) | | | | | | | |
| | | L-655 (amine equivalent 700 g/mol) | | | | | | | |
| | | KF-857 (amine equivalent 830 g/mol) | 0.25 | 0.50 | 0.1 | 0.135 | 0.20 | 0.08 | 0.27 |
| | Second amino-modified silicone | KF-869 (amine equivalent 3800 g/mol) | | | | | | | |
| | | KF-859 (amine equivalent 6000 g/mol) | 0.75 | 1.50 | 0.3 | 0.27 | 0.20 | 0.32 | 0.135 |
| | | L-653 (amine equivalent 8300 g/mol) | | | | | | | |
| | Solvent | ethanol | | | 80 | | | | |
| | | isopropyl alcohol | 100 | 100 | | 100 | 100 | 100 | 100 |
| | | water | | | 20 | | | | |
| | Mass ratio of the first amino-modified silicone to the second amino-modified silicone | | 1:3 | 1:3 | 1:3 | 1:2 | 1:1 | 1:4 | 2:1 |
| Evaluation | (1) uneven application | | ○ | Δ | ○ | ○ | ○ | ○ | ○ |
| | (2) surface tension (mN/m) | after printing for 500 m | 23 | 23 | 23 | 23 | 23 | 23 | 30 |
| | | after printing for 1000 m | 23 | 23 | 23 | 23 | 23 | 30 | 30 |

TABLE 1-continued

| | | | | | | | | |
|---|---|---|---|---|---|---|---|---|
| | | after printing for 1500 m | 23 | 23 | 23 | 23 | 23 | 30 | 30 |
| | | after printing for 2000 m | 23 | 23 | 23 | 23 | 23 | 35 | 30 |
| | (3) plate surface contamination | after printing for 500 m | A | A | A | A | A | A | B |
| | | after printing for 1000 m | A | A | A | A | A | B | B |
| | | after printing for 1500 m | A | A | A | A | A | B | B |
| | | after printing for 2000 m | A | A | A | A | A | C | B |
| (4) uniformity of ink in solid part | | | ○ | Δ | ○ | ○ | ○ | ○ | ○ |

| | | | Comparative Example | | | | |
|---|---|---|---|---|---|---|---|
| | | | 1 | 2 | 3 | 4 | 5 |
| Solution | First amino-modified silicone | KF-393 (amine equivalent 350 g/mol) | | | | 0.4 | |
| | | L-655 (amine equivalent 700 g/mol) | | | 0.4 | | |
| | | KF-857 (amine equivalent 830 g/mol) | 0.05 | | | | 0.3 |
| | Second amino-modified silicone | KF-869 (amine equivalent 3800 g/mol) | | | | | |
| | | KF-859 (amine equivalent 6000 g/mol) | 0.35 | 0.4 | | | 0.1 |
| | | L-653 (amine equivalent 8300 g/mol) | | | | | |
| | Solvent | ethanol | | | | | |
| | | isopropyl alcohol | 100 | 100 | 100 | 100 | 100 |
| | | water | | | | | |
| | Mass ratio of the first amino-modified silicone to the second amino-modified silicone | | 1:7 | — | — | — | 3:1 |
| Evaluation | (1) uneven application | | ○ | ○ | ○ | ○ | ○ |
| | (2) surface tension (mN/m) | after printing for 500 m | 23 | 23 | 35 | 40 | 35 |
| | | after printing for 1000 m | 30 | 30 | 35 | 40 | 35 |
| | | after printing for 1500 m | 35 | 40 | 35 | 40 | 35 |
| | | after printing for 2000 m | 40 | 40 | 35 | 40 | 35 |
| | (3) plate surface contamination | after printing for 500 m | A | A | C | D | C |
| | | after printing for 1000 m | B | B | C | D | C |
| | | after printing for 1500 m | C | D | C | D | C |
| | | after printing for 2000 m | D | D | C | D | C |
| | (4) uniformity of ink in solid part | | ○ | ○ | ○ | ○ | ○ |

In Examples 1 to 10, although the combination of the first amino-modified silicone with the second amino-modified silicone are different from each other, the ratio by mass of the first amino-modified silicone to the second amino-modified silicone is 1:3 which is a suitable one whereby the ink-repelling property of the printing plate in the initial stage is high (i.e. the surface tension is low) and its persistency is also high. Therefore, plate surface contamination does not generate. In Examples 11 to 12, although the ratio by mass of the first amino-modified silicone to the second amino-modified silicone is within a range of 1:1 to 1:2, the result is the same as that in the case wherein the ratio by mass is 1:3. In Example 13, the ratio by mass of the first amino-modified silicone to the second amino-modified silicone is 1:4 and persistency is lower than Examples 1 to 12. In Example 14, the ratio by mass of the first amino-modified silicone to the second amino-modified silicone is 2:1 whereby the ink-repelling property in the initial stage is a bit insufficient and the plate surface contamination generates as from the initial stage. In Comparative Example 1, the ratio by mass of the first amino-modified silicone to the second amino-modified silicone is 1:7 whereby the ink-repelling property in the initial stage is high (i.e. surface tension is low) but the persistency is inferior to those in the Examples. In Comparative Example 2, the second amino-modified silicone is used solely and the persistency is inferior to Comparative Example 1. In Comparative Examples 3 and 4, the second amino-modified silicone is not used whereby the ink-repelling property is bad and, in any of them, the plate surface contamination generates as from the initial stage of the printing. In Comparative Example 5, the ratio by mass of the first amino-modified silicone to the second amino-modified silicone is 3:1 whereby the ink-repelling property is low (i.e. surface tension is high) even as from the initial stage.

INDUSTRIAL APPLICABILITY

In accordance with the production method of the present invention, the plate surface contamination does not generate during long time even in the case of printing using a solvent-type ink. Accordingly, it is now possible to provide a flexographic printing plate which allows stable high-quality printing in a large scale.

The invention claimed is:

1. A method for producing a flexographic printing plate from a flexographic printing original plate provided with a photosensitive resin layer comprising a photosensitive resin composition containing at least (A) a hydrophobic polymer comprising a water-dispersible latex, (B) a photopolymerizable compound and (C) a photopolymerization initiator, wherein the method comprises a main exposure step, a development step and a post-exposure step, characterized in that a treatment solution containing a first amino-modified silicone having an amine equivalent of 1000 g/mol or less and a second amino-modified silicone having an amine equivalent of 3000 g/mol or more in a mass ratio of from 2.5:1 to 1:6 is contacted with the whole surface of the flexographic printing plate.

2. The method for producing a flexographic printing plate according to claim 1, wherein contact of the treatment solution is carried out by means of application of the treatment solution to the surface of the printing plate or by means of immersion of the printing plate into the treatment solution.

3. The method for producing a flexographic printing plate according to claim 1, wherein contact of the treatment solution is carried out after the development step and immediately before the post-exposure step.

* * * * *